United States Patent [19]
Lammert

[11] Patent Number: 5,686,743
[45] Date of Patent: Nov. 11, 1997

[54] METHOD OF FORMING AIRBRIDGED METALLIZATION FOR INTEGRATED CIRCUIT FABRICATION

[75] Inventor: Michael D. Lammert, Manhattan Beach, Calif.

[73] Assignee: TRW Inc., Redondo Beach, Calif.

[21] Appl. No.: 679,637

[22] Filed: Jul. 10, 1996

[51] Int. Cl.[6] .................................................. H01L 23/48
[52] U.S. Cl. .............................................. 257/276; 257/776
[58] Field of Search ..................................... 257/276, 522, 257/776

[56] References Cited

U.S. PATENT DOCUMENTS

| | | | |
|---|---|---|---|
| 3,693,251 | 9/1972 | Jaccodine | 29/842 |
| 3,932,226 | 1/1976 | Klatskin et al. | 437/9 |
| 4,118,595 | 10/1978 | Pfahnl et al. | 174/256 |
| 4,289,846 | 9/1981 | Parks et al. | 430/314 |
| 4,436,766 | 3/1984 | Williams | 427/96 |
| 4,601,915 | 7/1986 | Allen et al. | 427/96 |
| 4,972,250 | 11/1990 | Omori et al. | 257/276 |
| 5,162,258 | 11/1992 | Lemnios et al. | 437/184 |
| 5,198,385 | 3/1993 | Devitt et al. | 437/51 |
| 5,219,713 | 6/1993 | Robinson | 430/314 |
| 5,283,452 | 2/1994 | Shih et al. | 257/276 |
| 5,306,653 | 4/1994 | Hur | 437/40 |
| 5,378,309 | 1/1995 | Rabinzohn | 216/13 |
| 5,408,742 | 4/1995 | Zaidel et al. | 29/846 |
| 5,449,929 | 9/1995 | Hosogi | 257/276 |

FOREIGN PATENT DOCUMENTS 446125  9/1991  European Pat. Off. .............. 257/276

*Primary Examiner*—Jerome Jackson
*Assistant Examiner*—John Guay
*Attorney, Agent, or Firm*—Michael S. Yatsko

[57] ABSTRACT

A method for forming an airbridge for interconnecting metal contacts on an integrated circuit. The airbridge is formed by initially patterning a support photoresist between the metal contacts to be interconnected, over the metal contact to be crossed. The pattern support photoresist is flood exposed with UV light and subsequently baked at a relatively high temperature to cause the support photoresist to flow into a generally spherical shape. The airbridged metal lines are patterned over the spherically shaped support photoresist. Excess metallization is lifted off the support photoresist and the photoresist used to pattern the airbridge is removed, forming an airbridge with curvature along both its width and length.

2 Claims, 4 Drawing Sheets

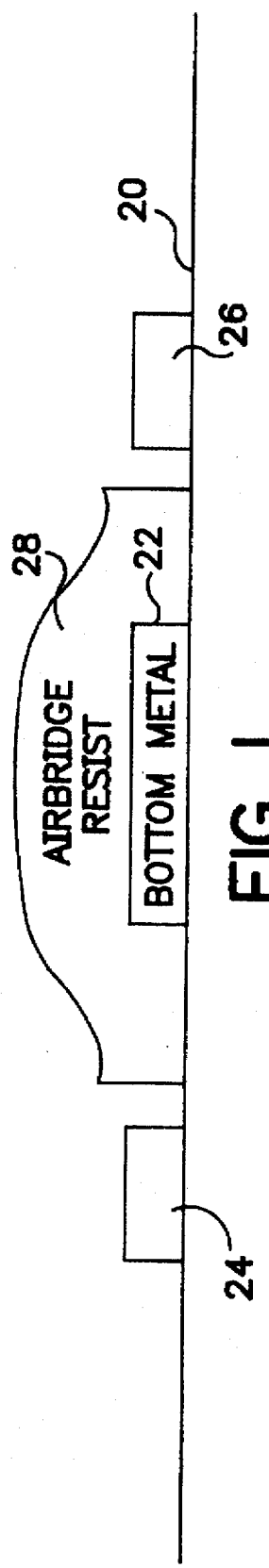
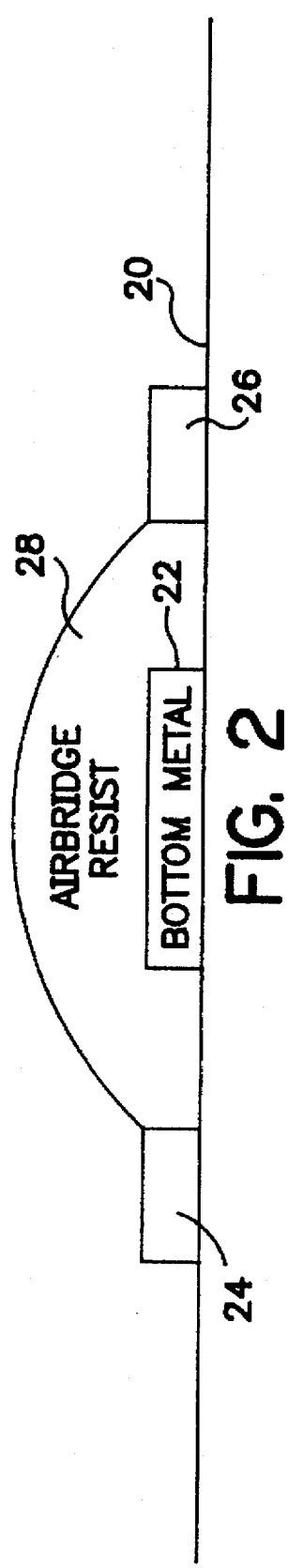

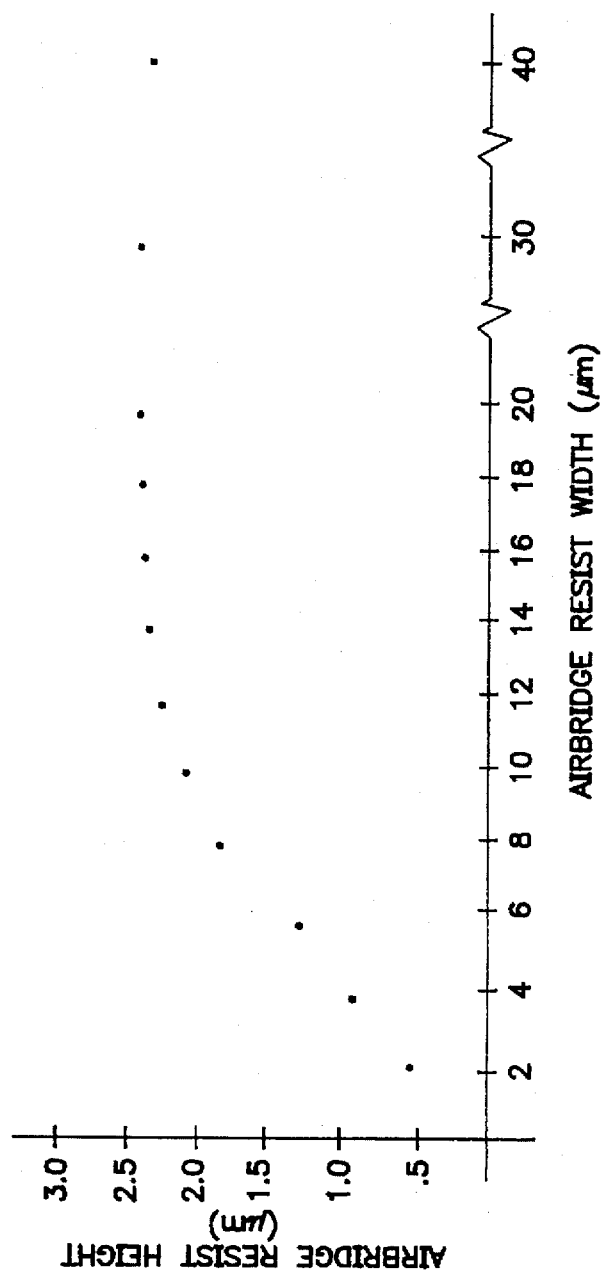
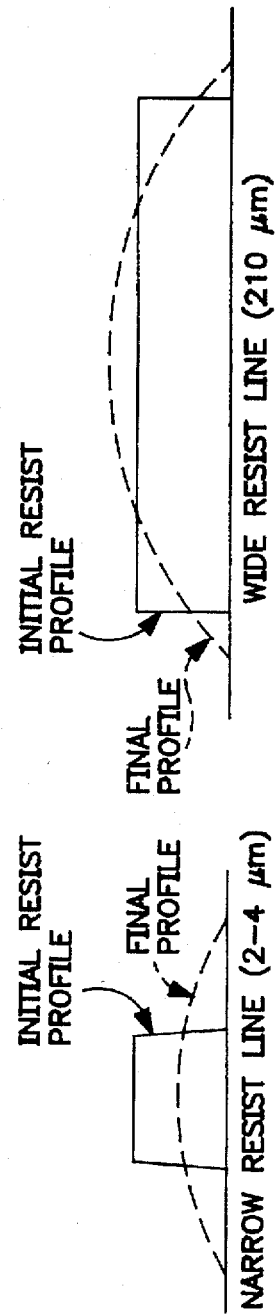
FIG. 7
FIG. 8
FIG. 9

METHOD OF FORMING AIRBRIDGED METALLIZATION FOR INTEGRATED CIRCUIT FABRICATION

The invention described herein was developed during the course of a Contract or Subcontract No. N66001-92-C-6018 with the Department of Defense.

BACKGROUND OF THE INVENTION

1. Field of the Invention

The invention relates to monolithic integrated circuits (IC) and, more particularly, to a method for interconnecting a plurality of metal contacts on an integrated circuit by way of a curved airbridge which crosses over other metal contacts on the IC, separated therefrom by air, wherein the airbridge is formed with a curvature along its width and length resulting in increased strength.

2. Description of the Prior Art

Various techniques are known for interconnecting metal contacts on an integrated circuit. Examples of such techniques are disclosed in U.S. Pat. Nos. 3,932,226; 3,693,251; 4,118,595; 4,289,846; 4,436,766; 4,601,915; 5,162,258; 5,198,385; 5,219,713; and 5,408,742.

U.S. Pat. No. 4,118,595 discloses a method for interconnecting spaced-apart metal contacts on an integrated circuit by way of a cross-over bridge. The cross-over bridge disclosed in the '595 patent is separated from other contacts on the integrated circuit by way of a dielectric. In particular, a dielectric insulating layer is formed over certain metal contacts to be crossed over on the integrated circuit. Copper is plated directly onto the insulated layer to interconnect the contacts disposed adjacent the contacts to be crossed over. Unfortunately, such a configuration results in a relatively high parasitic capacitance between the crossing metal lines.

As such, airbridged metal lines are known to be used to interconnect contacts in order to reduce the capacitance. In such airbridged metal lines, the metal conductors are separated by air. Examples of techniques for forming so-called airbridges are disclosed in U.S. Pat. Nos. 3,693,251; 3,932,226; 4,289,846; 4,436,766; 4,601,915; 5,162,258; 5,198,385; 5,219,713; and 5,408,742.

Airbridged metal lines are known to be formed on integrated circuits by plating the metal lines. In general, the process consists of forming an airbridge resist, sputtering a plating medium, patterning and plating the airbridged metal, stripping the airbridge metal resist, stripping the remaining plating medium and, finally, stripping the airbridge resist. Examples of airbridges formed by plating are disclosed in U.S. Pat. Nos. 4,436,766 and 5,198,385.

Airbridges fabricated using plating techniques often require multiple photoresist applications and plating media metallization, which must be removed subsequently. Unfortunately, such methods are relatively complex and are thus relatively time-consuming. Also, such methods require the integrated circuit to be subjected to relatively harsh chemical plating and chemical etching environments which can cause damage to the integrated circuit. In addition, such techniques also have an effect on the minimum allowable metal line width and spacing.

In order to avoid the limitations of forming airbridges which utilizing plating steps, various techniques have been developed, as disclosed in U.S. Pat. Nos. 4,436,766; 5,219,713; and 5,408,742. Such techniques are rather complex as well and are known to involve a substantial number of process steps.

Another problem with known methods for forming airbridges is the geometric configuration of the bridge. In particular, as disclosed in U.S. Pat. Nos. 5,408,742 and 5,219,713, the curvature of the airbridge generally extends in only one direction. In other words, the bridge is formed as an elongated strip, generally flat along its width, and curved along its length. The mechanical strength of such a configuration is relatively limited.

SUMMARY OF THE INVENTION

It is an object of the present invention to provide a method for forming an airbridge for interconnecting metal contacts on an integrated circuit, which solves the problems of the prior art.

It is yet another object of the present invention to provide a method for forming an airbridge which obviates the need for plating.

It is yet another object of the present invention to provide a method for forming an airbridge which involves relatively few process steps.

It is yet a further object of the present invention to provide a method for forming an airbridge with increased mechanical strength relative to known methods.

It is yet another object of the present invention to provide a method for forming multiple airbridged metal lines simultaneously.

It is yet a further object of the present invention to provide a method for forming an airbridge that is adapted to connect to metal contacts at the top of device mesas.

Briefly, the present invention relates to a method for forming an airbridge for interconnecting metal contacts on an integrated circuit. The airbridge is formed by initially patterning a support photoresist between the metal contacts to be interconnected, over the metal lines to be crossed. The pattern support photoresist is flood exposed with UV light and subsequently baked at a relatively high temperature to cause the support photoresist to flow into a generally spherical shape. The airbridged metal lines are patterned over the spherically shaped support photoresist. Excess metallization is lifted off the support photoresist and the photoresist used to pattern the airbridge is removed, forming an airbridge with curvature along both its width and length.

BRIEF DESCRIPTION OF THE DRAWING

These and other objects of the present invention will be readily understood with reference to the following specification and attached drawing, wherein:

FIG. 1 is a partial cross-sectional view of an integrated circuit substrate illustrating an initial step in the method in accordance with the present invention, forming a support photoresist over a metal line to be crossed.

FIG. 2 is similar to FIG. 1, illustrating the configuration of the support photoresist after UV exposure and baking in accordance with the present invention.

FIG. 7 is a graphical illustration illustrating the airbridged support photoresist height as a function of the photoresist width for a 50 µm long support photoresist pattern, having an initial thickness of about 2 µm.

FIG. 8 is a elevational view illustrating the initial support photoresist profile compared to the final resist profile for a relatively narrow support photoresist profile of about 2–4 µm.

FIG. 9 is similar to FIG. 8 for a relatively wide (≧10 µm) support photoresist.

DETAILED DESCRIPTION OF THE INVENTION

Figure 3:
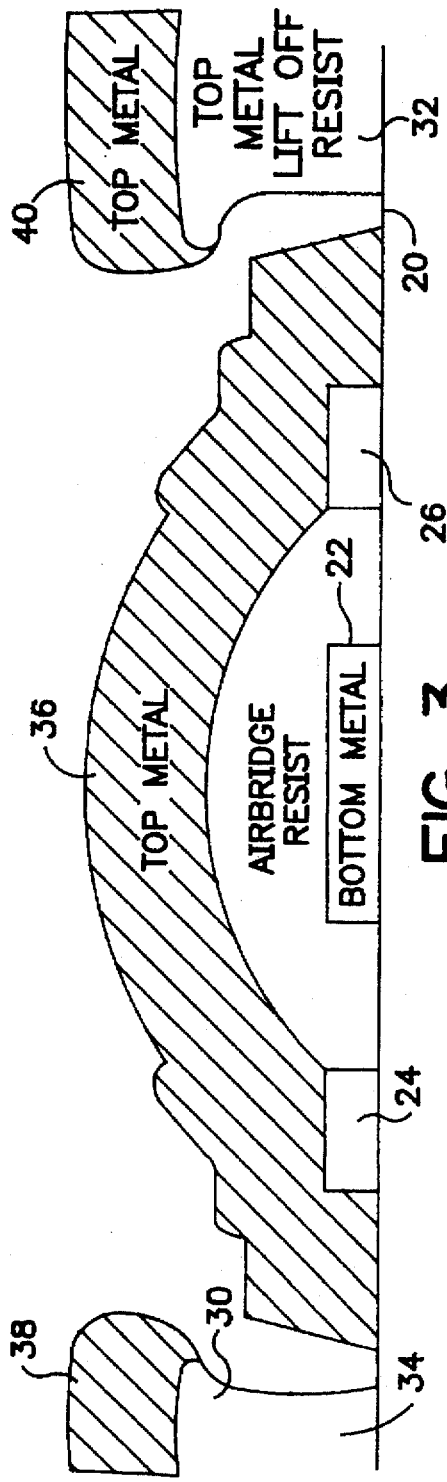
FIG. 3 is similar to FIG. 2, illustrating the patterning of the top metal photoresist and the deposition of the top metal.

An important aspect of the invention is that the method for fabricating the airbridged metal line requires only a few extra processing steps relative to a conventional lift-off metallization process. More particularly, with reference to FIGS. 1–4, the integrated circuit substrate, generally identified with the reference numeral 20, is fabricated by well-known techniques which do not form a part of the present invention. In order to illustrate the method in accordance with the present invention, an elongated metal line 22, is shown formed on the substrate. The metal line 22 is shown disposed between a pair of spaced-apart contacts, identified with the reference numerals 24 and 26. The contacts 24 and 26 represent any two contact regions on an integrated circuit that need to be connected, but are separated by one or more metal lines, as represented by the metal line 22. As will be discussed below, the method in accordance with the present invention is used to interconnect the contacts 24 and 26 by way of an airbridge over the metal line 22. However, an important aspect of the invention is that the method can also be used to connect contacts or contact areas located at the top of device mesas. In such an application, the contacts 24 and 26 are formed on a mesa above the plane of the substrate 20.

In order to form an airbridged metal line over the metal line 22, a support 28 is formed over the metal line 22. The support 28 is formed with a positive photoresist to a height slightly less than the height of the desired airbridged metal line. The positive photoresist 28 is spun on the surface of the substrate 20, as well as over the metal line 22. The configuration of the support photoresist is patterned using known photolithography techniques. In particular, a photo mask (not shown) is patterned such that the size of the photoresist 28 will be slightly wider than the desired width of the airbridged metal line, for example, 2–10 µm wider than the desired width of the airbridged metal line. The photoresist 28 is also patterned to be about 2–10 µm longer than the width of the metal line 22 being crossed.

FIG. 7 shows the relationship between the peak photoresist height as a function of the width of the airbridged metal line for a 50 µm long photoresist pattern having an initial thickness of 2 µm. The data illustrated in FIG. 7 assumes a flood exposure of about 40 mJ/cm² and a bake temperature of 190° C. As shown in FIG. 7, the height of the photoresist 28 is linearly related to the width of the photoresist 28 up to a width of about 10 µm and has a maximum height of about 3 µm for photoresist widths in the range of 15 µm to 40 µm.

The photo mask is disposed adjacent the photoresist 28 and exposed with UV light and developed in a conventional manner to lead the configuration of the photoresist 28 as generally shown in FIG. 1.

After development, the patterned photoresist 28 is flood-exposed with UV light, using a similar wavelength light used to pattern the photoresist 28, as described above, at an exposure typically in the range of 10 mJ/cm² to 200 mJ/cm². The photoresist 28 is then baked at a temperature of about 150° C. to 200° C. The baking step causes the photoresist 28 to flow, as generally shown in FIG. 2, to a generally spherical shape. The baking also prevents the photoresist 28 from dissolving when the photoresist for the metal lines is applied. The exposure time and baking temperature are chosen to produce the desired photoresist 28 profile for the thickness of the photoresist 28 being used in the range of sizes of photoresist patterns being fabricated. In general, longer flood exposures and higher bake temperatures produce more flow of the patterned photoresist 28, which yields a more tapered, but higher peaked resist pattern. Depending on the desired profile for the photoresist 28 for a given application, no flood exposure may be required. FIGS. 8 and 9, illustrate the relative flow for the photoresist 28 for a relatively narrow photoresist (i.e., 2–4 µm), typically used for connecting contacts on device mesas, as compared to a relatively wide line, as shown in FIG. 9 (i.e. >10 µm) for metal line crossings, as shown in FIGS. 1–4.

Figure 4:
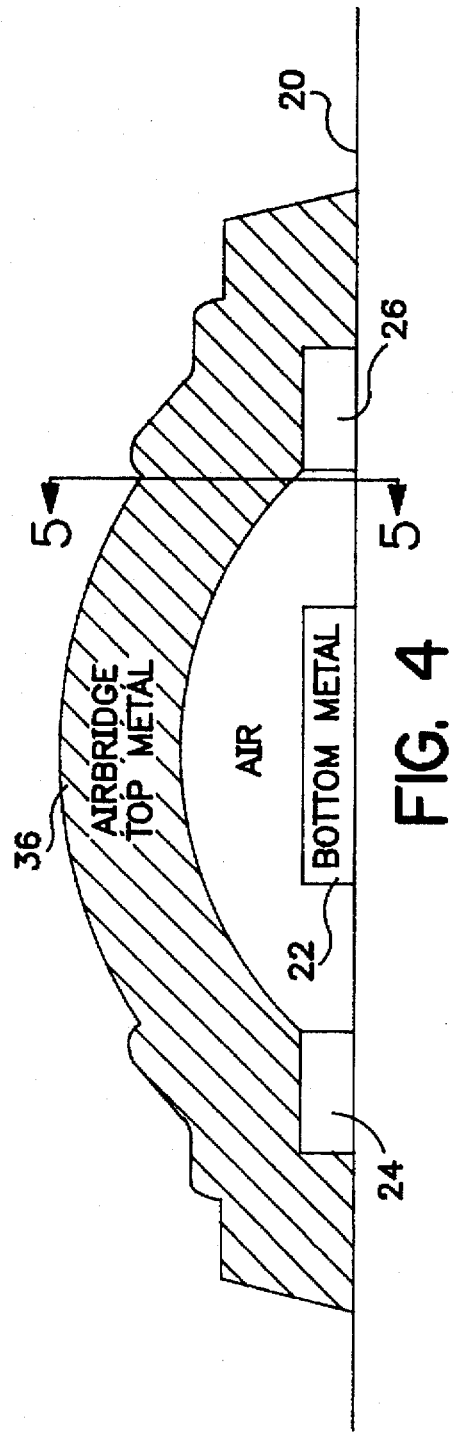
FIG. 4 is similar to FIG. 3, illustrating the airbridge formed with the method in accordance with present invention after the excess metallization of the top metal is lifted off and the airbridged support is removed.
Figure 5:
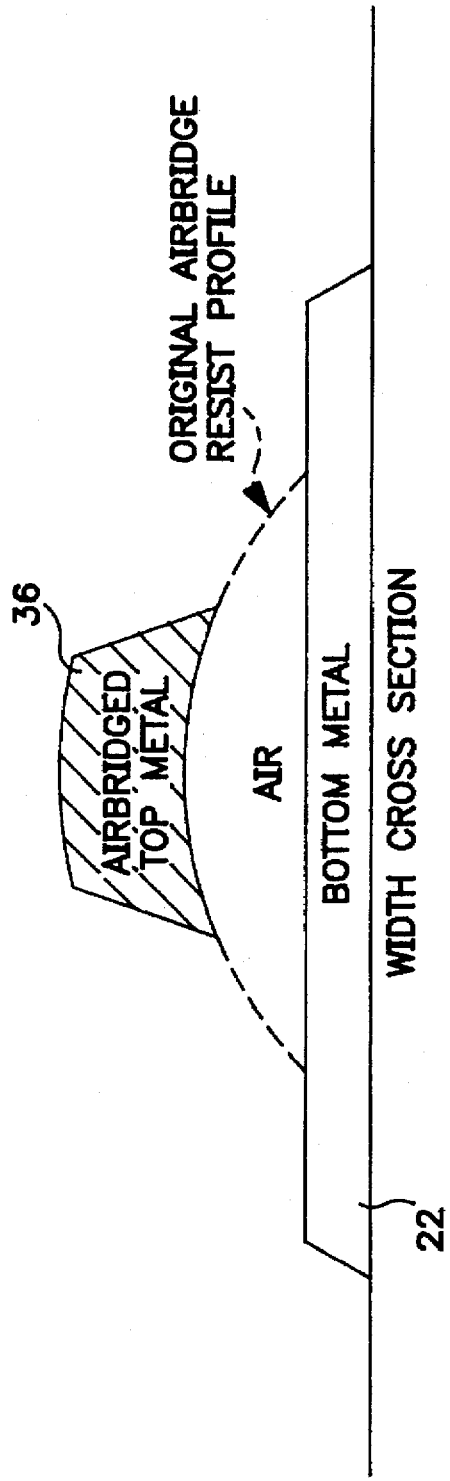
FIG. 5 is a sectional view taken along line 5—5 of FIG. 4.

After the photoresist 28 is formed in the generally spherical configuration as shown in FIG. 2, a second photoresist 30 is applied over the entire substrate 20, including the generally spherically shaped photoresist 28. The photoresist 30 is patterned by one of many conventional techniques to form the re-entrant lift-off profile at the edges of resist regions 32 and 34, diametrically disposed relative to the generally spherically shaped photoresist 28. A metallization layer, generally identified with the reference numerals 36, 38 and 40, is deposited on top of the substrate 20, leaving a metal layer on top of the photoresist 28, by conventional techniques, such as evaporation. In particular, metal layers 38 and 40 are formed on top of the resist regions 32 and 34, formed in the photoresist 30. In addition, a metal layer 36 is formed on top of the generally spherically shaped photoresist 28. The metal layer 36 forms the airbridged metal line and generally conforms to the generally spherical shape of the photoresist 28, such that the metal layer 36 has curvature along its length as generally shown in FIG. 3, as well as curvature relative to its width, as shown in FIG. 5. The excess metallization layers 38 and 40, as well as the means 32 and 34 formed by the photoresist 30 are lifted off by conventional techniques, leaving an airbridged metal line 36, as shown in FIGS. 4 and 5, which conforms to the shape of the generally spherically shaped support formed by the photoresist 28. As such, the airbridged metal line 36 will have curvature not only along its length, as shown in FIG. 4, but also about its width, as shown in FIG. 5. As such, the airbridged metal line 36 has increased strength relative to airbridged metal lines formed by other techniques in which the airbridged metal lines are not configured with curvature in two dimensions.

Figure 6:
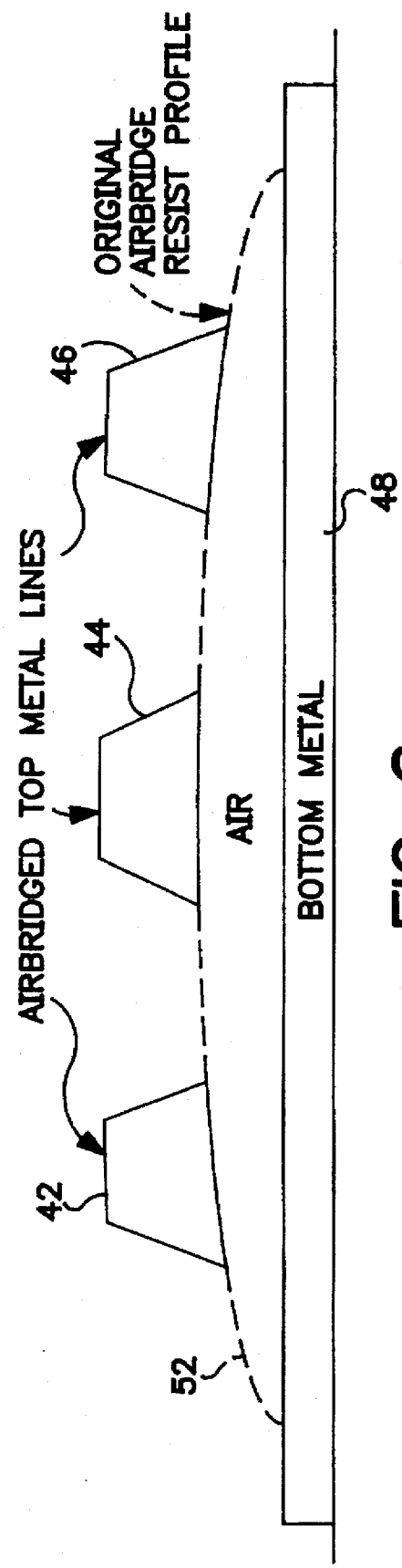
FIG. 6 is an alternate embodiment of the invention illustrating multiple airbridged metal lines crossing a single contact in accordance with method in accordance with the present invention.

The method in accordance with the present invention can also be used for simultaneously forming multiple airbridged metal lines over a metal line or lines, as shown in FIG. 6. More particularly, as shown in FIG. 6, multiple, for example, three airbridged metal lines, 42, 44 and 46 are formed crossing over a metal contact or metal line 48 disposed on a substrate 50. These multiple airbridged metal lines 42, 44 and 46 are formed by a single airbridged support 52, as discussed above, at a spacing limited only by the limitations of the lift-off photoresist technology. Since multiple airbridged metal lines 42, 44 and 46 are formed on a single support 52, the total width of the multiple lines is substantially smaller than the total width of the same number of single lines, each on their own airbridge support region. For such small widths, the airbridged metal lines 42, 44 and 46 are essentially linear across their width, while having curvature along the length, as generally illustrated in FIG. 4. While such airbridged metal lines 42, 44 and 46 are generally not as strong as the airbridged metal line 36, formed with curvature along both its width and its length, such airbridged metal lines 42, 44 and 46 are suitable for shorter airbridge spans. The multiple airbridged metal lines 42, 44 and 46 are formed in a manner similar even to the single airbridged metal lines 36 discussed above, except that the metallization layer will be patterned to form multiple airbridged metal lines, instead of the single airbridged metal line as discussed above.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. An integrated circuit comprising:
   a substrate;
   a first contact and a second contact formed on said substrate, said second contact spaced away from said first contact;
   an object formed on said substrate between said first contact and said second contact; and
   an airbridged metal line having a predetermined length and a predetermined width electrically interconnecting said first contact and said second contact over said object, separated from said object by air, said airbridged metal line formed with curvature along at least a portion of said predetermined length and at least a portion of said predetermined width defining a generally hemispherical cross-section.

2. An integrated circuit as recited in claim 1, wherein said object is a metal line.

\* \* \* \* \*